(12) United States Patent
Lu et al.

(10) Patent No.: US 7,884,376 B2
(45) Date of Patent: Feb. 8, 2011

(54) OPTOELECTRONIC SEMICONDUCTOR DEVICE AND MANUFACTURING METHOD THEREOF

(75) Inventors: Chih-Chiang Lu, Hsinchu (TW); Wei-Chih Peng, Hsinchu (TW); Shiau-Huei San, Hsinchu (TW); Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 21 days.

(21) Appl. No.: 12/230,203

(22) Filed: Aug. 26, 2008

(65) Prior Publication Data
US 2008/0315236 A1    Dec. 25, 2008

Related U.S. Application Data

(63) Continuation-in-part of application No. 11/160,588, filed on Jun. 29, 2005, and a continuation-in-part of application No. 11/160,589, filed on Jun. 29, 2005, and a continuation-in-part of application No. 10/905,697, filed on Jan. 18, 2005.

(30) Foreign Application Priority Data
Aug. 27, 2007   (TW) .................. 96131956 A

(51) Int. Cl.
*H01L 27/15*   (2006.01)
*H01L 33/00*   (2006.01)
(52) U.S. Cl. .................. 257/81; 257/98; 257/99; 257/E33.062; 257/E33.065; 257/E33.066

(58) Field of Classification Search ............... 257/98, 257/E33.066, 99, E33.065, E33.062, 81
See application file for complete search history.

(56) References Cited

U.S. PATENT DOCUMENTS

| | | | |
|---|---|---|---|
| 5,925,896 A * | 7/1999 | Dutta ................ | 257/79 |
| 6,649,437 B1 * | 11/2003 | Yang et al. .......... | 438/30 |
| 6,838,704 B2 * | 1/2005 | Lin et al. ........... | 257/98 |
| 6,903,381 B2 * | 6/2005 | Lin et al. ........... | 257/99 |
| 7,242,025 B2 * | 7/2007 | Eisert et al. ........ | 257/79 |
| 2003/0160258 A1 * | 8/2003 | Oohata ............... | 257/99 |
| 2005/0104080 A1 * | 5/2005 | Ichihara et al. ...... | 257/98 |
| 2005/0167659 A1 * | 8/2005 | Hsieh et al. ......... | 257/40 |
| 2005/0194587 A1 | 9/2005 | Hsieh et al. | |
| 2005/0263776 A1 | 12/2005 | Hsieh et al. | |
| 2006/0002442 A1 | 1/2006 | Haberern et al. | |
| 2006/0006524 A1 | 1/2006 | Hsieh | |

FOREIGN PATENT DOCUMENTS

JP    2006-093493    4/2006

* cited by examiner

*Primary Examiner*—Wael M Fahmy
*Assistant Examiner*—Sarah K Salerno
(74) *Attorney, Agent, or Firm*—Bacon & Thomas, PLLC

(57) ABSTRACT

An embodiment of the invention discloses an optoelectronic semiconductor device comprising a semiconductor system capable of performing a conversion between light energy and electrical energy; an interfacial layer formed on at least two surfaces of the semiconductor system; an electrical conductor; and an electrical connector electrically connecting the semiconductor system to the electric conductor.

23 Claims, 20 Drawing Sheets

OPTOELECTRONIC SEMICONDUCTOR DEVICE AND MANUFACTURING METHOD THEREOF

This application is a continuation-in-part application of co-pending U.S. application Ser. No. 11/160,588, filed Jun. 29, 2005, co-pending U.S. application Ser. No. 11/160,589, filed Jun. 29, 2005, and co-pending U.S. application Ser. No. 10/905,697, filed Jan. 18, 2005, and for which priority is claimed under 35 USC §120 of which the entire disclosures of the pending prior applications are hereby incorporated by reference and claims the right of priority of Taiwan Patent Application No. 096131956, filed on Aug. 27, 2007.

TECHNICAL FIELD

The invention relates to an optoelectronic semiconductor device and the manufacturing method thereof, and more particularly to an optoelectronic semiconductor device having a coupling structure made of conductive material and non-conductive material.

REFERENCE TO RELATED APPLICATION

This application claims the right of priority based on Taiwan application Ser. No. 096131956, filed Aug. 27, 2007, and the content of which is hereby incorporated by reference.

DESCRIPTION OF BACKGROUND ART

A well known structure of light-emitting diodes includes a growth substrate, n-type semiconductor layer, p-type semiconductor layer, and a light-emitting layer between the two semiconductor layers. A reflector for reflecting light from the light-emitting layer is also optionally formed in the structure. In some cases, to improve at least one of optical, electrical, and mechanical characteristics of the light-emitting diode, a well-selected material is used to replace the growth substrate and as a carrier to support the remaining structure without the growth substrate. For example, metal or silicon is used to replace sapphire substrate on which nitride is grown. The growth substrate is removed by etching, lapping, laser removal, etc. In addition, a transparent oxide can be adopted into the light-emitting diode to improve the current spreading.

There are several approaches to form an ohmic contact between the replacing carrier and the growth substrate. One of related materials can be referred to E. Fred Schubert, "Light-Emitting Diodes" chapter 9 (2006). Furthermore, the light-emitting diode finished products are made after being diced from a wafer; therefore, a suitable means used to protect semiconductor layers during the dicing process also becomes a notable issue. A usual protection means is a passivation layer formed on side walls of the semiconductor layer before dicing, but a careful control must be carried in each relevant step to avoid negative impact of forming the passivation layer.

SUMMARY OF THE DISCLOSURE

An optoelectronic semiconductor device in accordance with an embodiment of present invention includes a semiconductor system capable of performing a conversion between light energy and electrical energy; an interfacial layer formed on at least two surfaces of the semiconductor system; an electrical conductor; and an electrical connector.

Moreover, the optoelectronic semiconductor device of present invention has following preferable embodiments. The aforementioned two surfaces include a side surface and a surface facing to the electrical conductor. The conductor preferably is robust enough to support the semiconductor system. For example, the electrical conductor has a greater thickness or stiffness than the semiconductor system. More preferably, the electrical conductor is not made of semiconductor material. Furthermore, the electrical connector passes through the interfacial layer and electrically connects the semiconductor system and the electrical conductor with each other. The interfacial layer has a refraction index between the semiconductor system and an environmental medium.

In several other embodiments of present invention, the optoelectronic semiconductor device has following alternatives. A reflector is formed between the semiconductor system and the electrical conductor, and capable of reflecting light from the semiconductor system. A first coupling layer and a second coupling layer are respectively arranged on opposite sides of the electrical connector and electrically connected with each other. A first coupling layer is electrically connected to the semiconductor system and inserted into by at least part of the electrical connector. A first coupling layer is electrically connected to the semiconductor system and reflects light from the semiconductor system.

In other embodiments, the optoelectronic semiconductor device of present invention includes a first coupling layer electrically connected to the semiconductor system; and a reflector capable of reflecting light from the semiconductor system and positioned between the first coupling layer and the semiconductor system. Moreover, the optoelectronic semiconductor device further includes a reflector between the electrical connector and the semiconductor system, and contacting with the electrical connector.

In aforementioned embodiments of optoelectronic semiconductor devices, the electrical connectors have gaps varied in a configuration selected from the group consisting of constant periodicity, variable periodicity, quasi-periodicity, geometric series, and randomness. In addition, the electrical connector is formed in a shape selected from the group consisting of rectangle, circle, ellipse, triangle, hexagon, irregular shape, and the combination thereof. Moreover, the electrical connector includes a rough surface.

Following alternatives are disclosed in the further embodiments of present invention. The optoelectronic semiconductor device further includes a first intermediate layer electrically connecting to the semiconductor system; and a second intermediate layer formed on the electrical connector and between the first intermediate layer and the electrical connector. The optoelectronic semiconductor device further includes an electrode formed on the semiconductor system; and an insulating region corresponding to a position of the electrode and substantially arranged on the same horizontal plane with the electrical connector. The insulating region is optionally arranged on a horizontal plane different from that of the electrical connector.

Other embodiments are also disclosed in present application. For example, in the optoelectronic semiconductor device, the interfacial layer includes a wavelength converting material. Or the optoelectronic semiconductor device includes a passive light-emitting layer formed on a surface of the semiconductor system opposite to the electrical connector, and emitting output light in response to input light from the semiconductor system, wherein the input light and the output light have a different wavelength or spectrum. In addition, the optoelectronic semiconductor device includes a light extraction surface formed on a primary light output surface of the semiconductor system and in a configuration selected from the group consisting of rough surface, regular convex and concave structure, irregular convex and concave structure, and photonic crystal.

DETAILED DESCRIPTION OF PREFERRED EMBODIMENTS

The embodiments are described hereinafter in accompany with drawings.

Figure 1A:
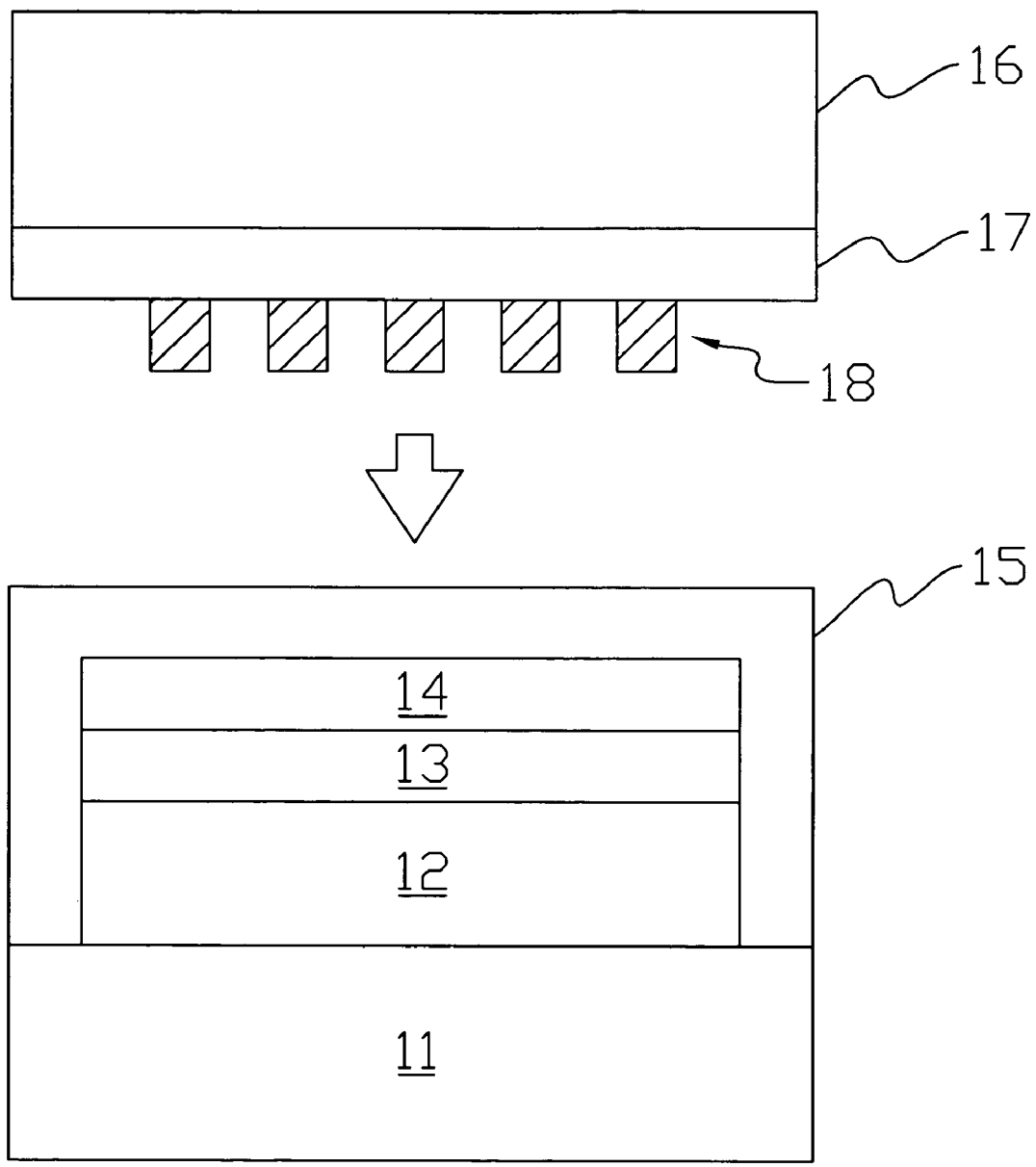
FIGS. 1A~1C illustrate a manufacturing process of an optoelectronic semiconductor device in accordance with an embodiment of present invention.

As shown in FIG. 1A, a semiconductor system 12 is firstly formed on a temporary substrate 11. The semiconductor system 12 is a semiconductor device capable of performing a conversion between light energy and electronic energy, such as light-emitting diode (LED), laser diode (LD), and solar cell. However, the term "semiconductor system" in present application does not mean that the sub-systems or units are all made of semiconductor material. Other non-semiconductor material, such as metal, oxide, and insulator, can be optionally integrated into the semiconductor system.

An exemplary light-emitting diode has a structure including at least two semiconductor layers having different electric properties, polarities, or dopants, and a light-emitting layer (or called "active layer") between the two semiconductor layers. A light-emitting spectrum of the light-emitting diode can be adjusted by modifying the composition of the constructed material. The common available material includes AlGaInP series, AlGaInN series, and ZnO series. In addition, the light-emitting layer can be formed in a structure such as single heterostructure (SH), double heterostructure (DH), double-side double heterostructure (DDH), or multi-quantum well (MQW). The light-emitting wavelength can be further modified by changing the pair number of the multi-quantum well. The temporary substrate 11 is used to grow or support semiconductor system 12. The suitable material of the temporary substrate 11 includes but not limited to Ge, GaAs, InP, sapphire, SiC, Si, LiAlO$_2$, ZnO, GaN, glass, composite, diamond, CVD diamond, and diamond-like carbon (DLC).

After the semiconductor system 12 is formed on the temporary substrate 11, a reflector 13 can be optionally formed to reflect light directly or indirectly form the light-emitting layer towards a specific direction. The reflector 13 is constructed by using metal such as Ag, Al, Au, Cu, and Ti, or distributed Bragg reflector (DBR). The reflector 13 can be formed on all or part of surfaces of the semiconductor system 12.

A first coupling layer 14 is formed to couple with the following device or structure after the reflector 13 is completed. The material adopted into the first coupling layer 14 depends on the selected technology. With metal bonding technology, the first coupling layer 14 can be formed by material such as In, Pd, Au, Cr, or alloy thereof. With glue bonding technology, the first coupling layer 14 can be formed by material such as epoxy, benzocyclobutene (BCB), or SU-8 photo resistor. With eutectic bonding technology, the first coupling layer 14 is formed by material including but not limited to Au, Sn, In, Ge, Zn, Be, and Si.

The semiconductor system 12 and the layers covering thereon are then etched by inductively coupled plasma (ICP) or other suitable dry etching technology until a part of the temporary substrate 11 is exposed. For example, the semiconductor system 12 and the covering layers like the reflector 13 and the first coupling layer 14 are removed to form a rim, as shown in FIG. 1A, or etched to reach a position of the light-emitting layer of the light-emitting diode. An interfacial layer 15 is then spin-coated on the semiconductor system 12 and the layers covering thereon. For example, in FIG. 1A, the interfacial layer 15 is overlaid on the side surfaces of the semiconductor system 12, the reflector 13 and the first coupling 14, and the top surface of the first coupling layer 14. The interfacial layer 15 is between the semiconductor system 12 and an environmental medium, and can be made of insulating material such as epoxy and benzocyclobutene (BCB).

An electrical conductor 16 is provided to have a second coupling layer 17 and electrical connectors 18 disposed thereon. The electrical conductor 16 is used to carry the semiconductor system 12, functions as a current channel, and is robust enough to form a stable structure. The electrical conductor 16 is formed by conductive material such as Ge, GaAs, InP, SiC, Si, LiAlO$_2$, ZnO, GaN, Cu, and Al. The electrical conductor 16 can be a separate structure as shown in FIG. 1A and coupled with the related structures of the semiconductor system 12 by a specific method. In another aspect, the electrical conductor 16 can be formed by electroplating, bonding, or deposition after the electrical connector 18 is completed on the semiconductor system 12.

The material of the second coupling layer 17 can refer to the first coupling layer 14 mentioned in the above description. Moreover, the material of the second coupling layer 17 can be different from or the same as that of the first coupling layer 14. Other than the embodiments in each drawing, the first coupling layer 14 and the second coupling layer 17 can be used alternatively. The material of the electrical connector 18 is such as In, Sn, Al, Ag, Au/Be, Au/Ge, Au/Zn, Ni, Pd, Pb/Sn, Pd, Pt, Zn, Ge, Ti, Cu, or Cr. Besides, provided one kind of material or structure can meet the required specifications of three or any two of the electrical connector 16, the second coupling layer 17, and the electrical connector 18, the corresponding parts can be integrated into one unit.

Figure 1B:
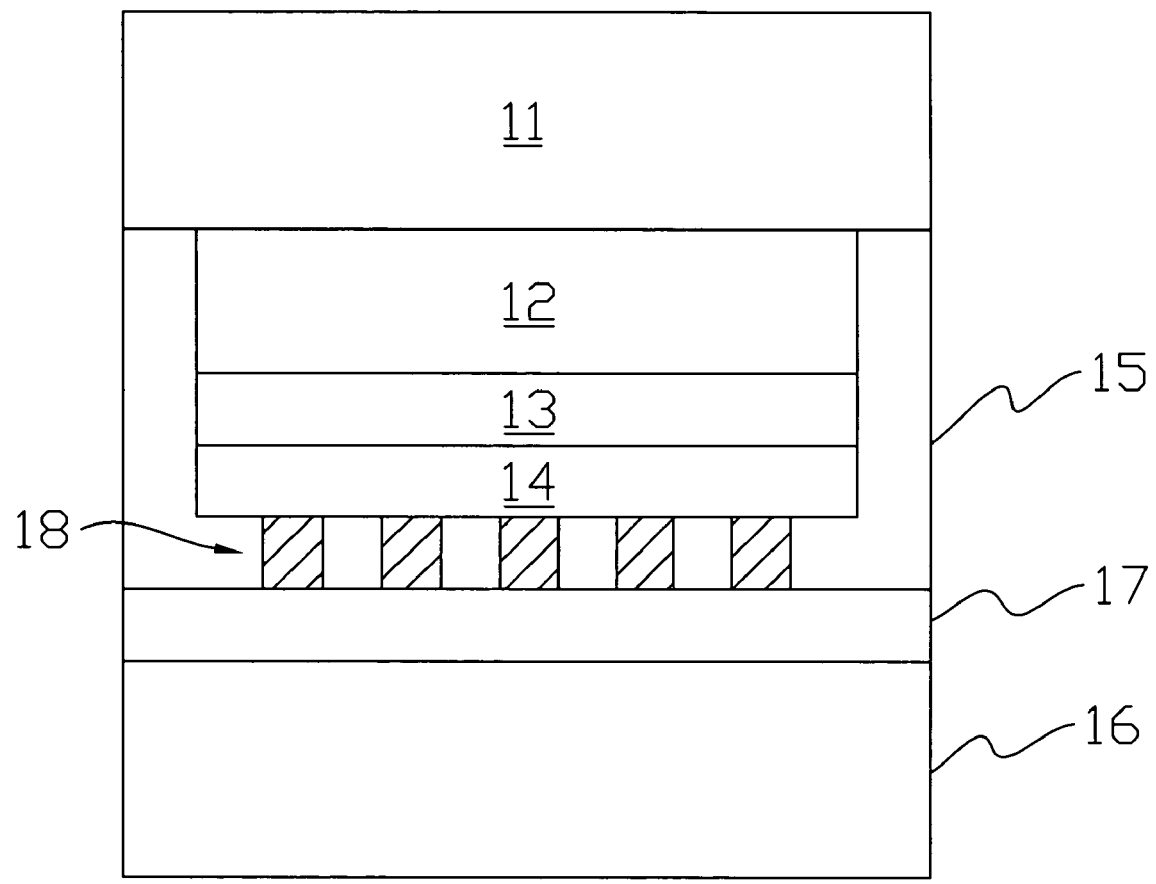

The interfacial layer 15 and the second coupling later 17 are brought to connect when the aforementioned preparations are finished. In the case, the electrical connectors 18 are pressed into the interfacial layer 15, and at least part of the electrical connectors 18 passes through the interfacial layer 15 and electrically connects to the first coupling layer 14, as shown in FIG. 1B.

Figure 1C:
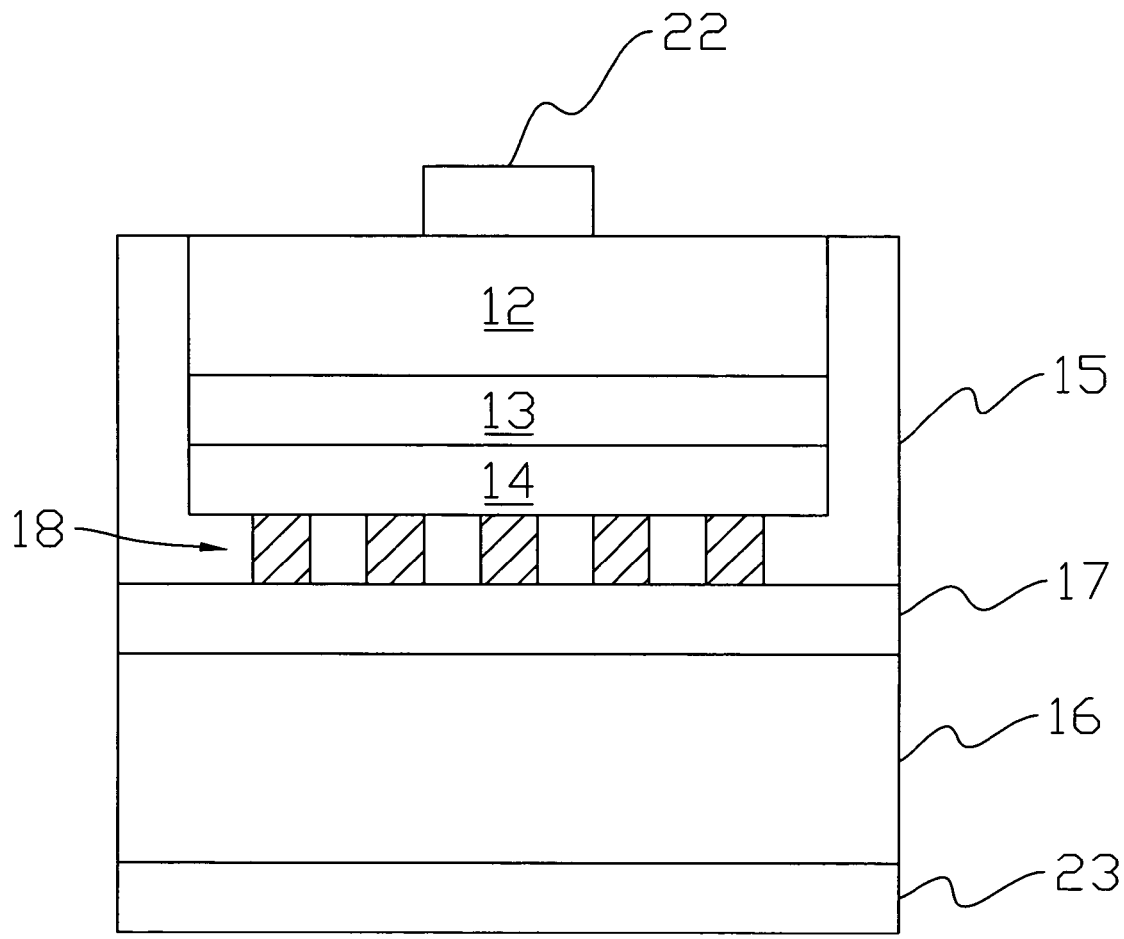

The temporary substrate 11 is then removed by wet etching, dry etching, mechanical polishing, or laser removal. After that, an upper electrode 22 and a lower electrode 23 are formed on the semiconductor system 12 and the electrical conductor 16 respectively. In addition, the lower electrode 23 can be formed on electrical conductor 16 before the semiconductor system 12 and the electrical conductor 16 are coupled together. Furthermore, the electrical conductor 16 can also function as an electrode provided it has necessary characteristics of an electrode. Therefore, it is not necessary to form the lower electrode 23 on the device 10. If the optoelectronic device 10 is provided as a "wafer" level, the wafer has to be cut in order to bring the optoelectronic device 10 into a single dice level. The structure out of the foregoing processes is shown in FIG. 1C. At least one material capable of forming the electrode 22, electrode 23, or both is such as In, Sn, Al, Ag, Au, Au/Be stack, Au/Ge stack, Au/Zn stack, Ni, Pd, Pt, Zn, Ge, Ti, Cu, or Cr.

The interfacial layer 15 is interposed between and integrates the first coupling layer 14 and the second coupling layer 17, and further covers on the side surface of the semiconductor system 12 to protect the system 12 from being damaged during the following manufacturing processes. In addition, if the refraction index of the interfacial layer 15 is between the semiconductor system 12 and the environmental medium, light from the semiconductor system 12 is not easily total-reflected in a presence of a great change among the refractive indices.

Figure 2A:
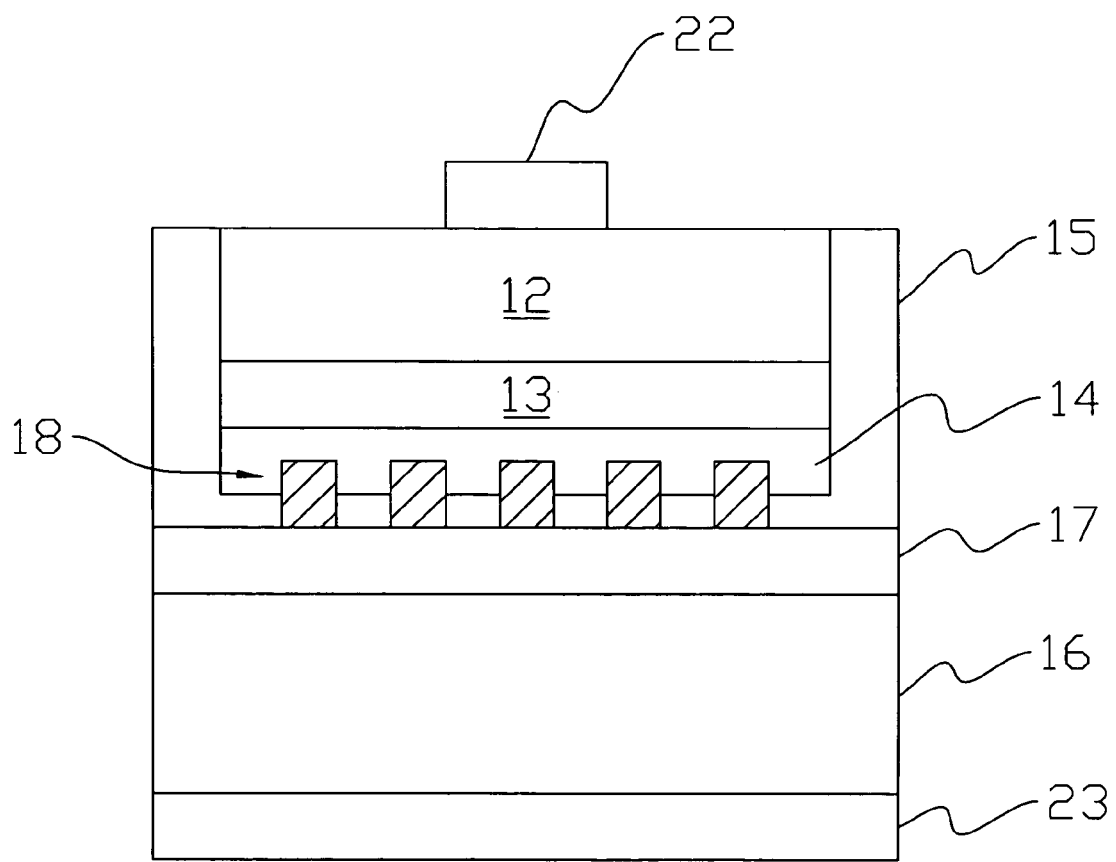
FIGS. 2A~2D illustrate cross sectional views of optoelectronic semiconductor devices in accordance with further embodiments of present invention.

In another embodiment, the electrical connector 18 even penetrates into the first coupling layer 14 by means of elongating the electrical connector 18 or compressing the interfacial layer 15 to reduce the thickness thereof. As shown in FIG. 2A, the electrical connector 18 has penetrated the interfacial layer 15 and been into the first coupling layer 14, but not yet reached the reflector 13. Moreover, the interfacial layer 15 still remains between the first coupling layer 14 and the second coupling layer 17. In the case, provided a suitable material is chosen for the electrical connector 18 and the first coupling layer 14, a metal bonding or a eutectic bonding can be formed between the two parts.

Figure 2B:
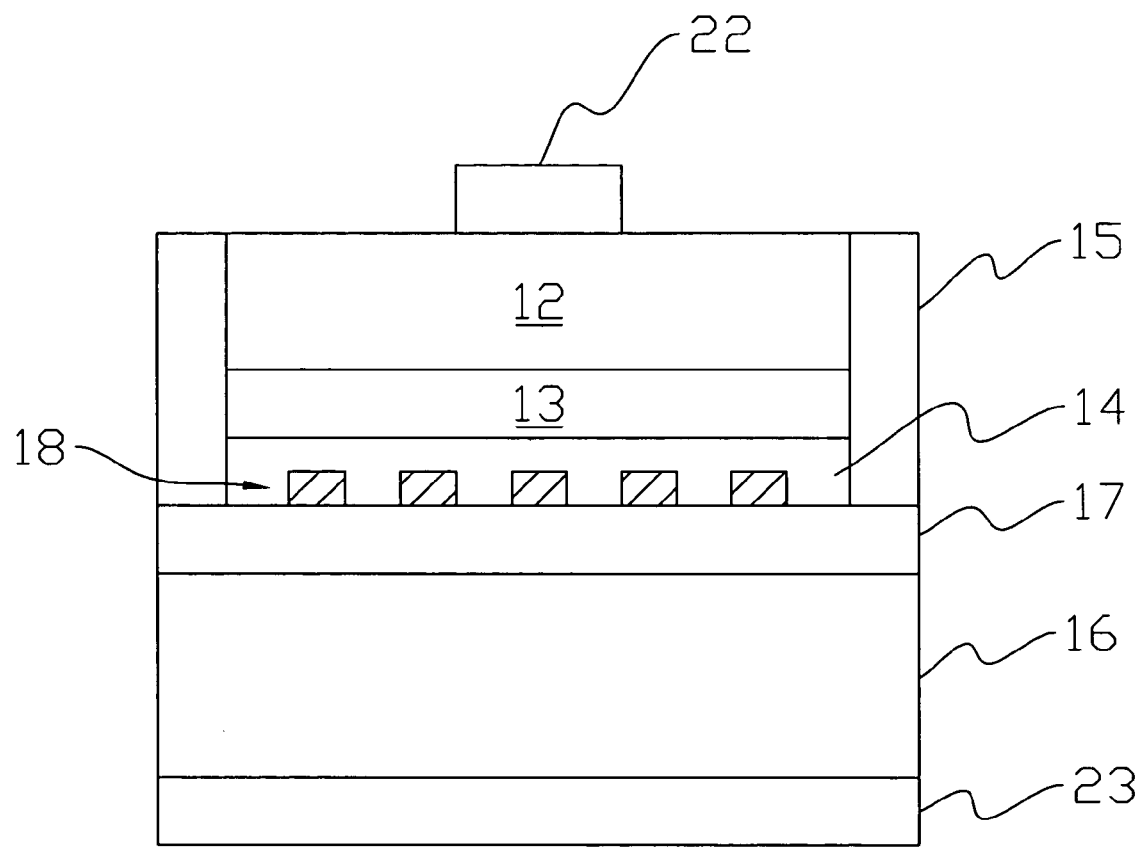

As shown in FIG. 2B, the electrical connector 18 penetrates the interfacial layer 15 and enters into the first coupling layer 14, but has not yet reached the reflector 13. Moreover, the first coupling layer 14 and the second coupling layer 17 are compressed to contact with each other. In the case, provided the first coupling layer 14 and the second coupling layer 17 are made by introducing suitable material, a metal bonding or a eutectic bonding can be formed between the two parts. Provided a suitable material is chosen for the electrical connector 18 and the first coupling layer 14, a metal bonding or a eutectic bonding can accordingly be formed between the two parts.

Figure 2C:
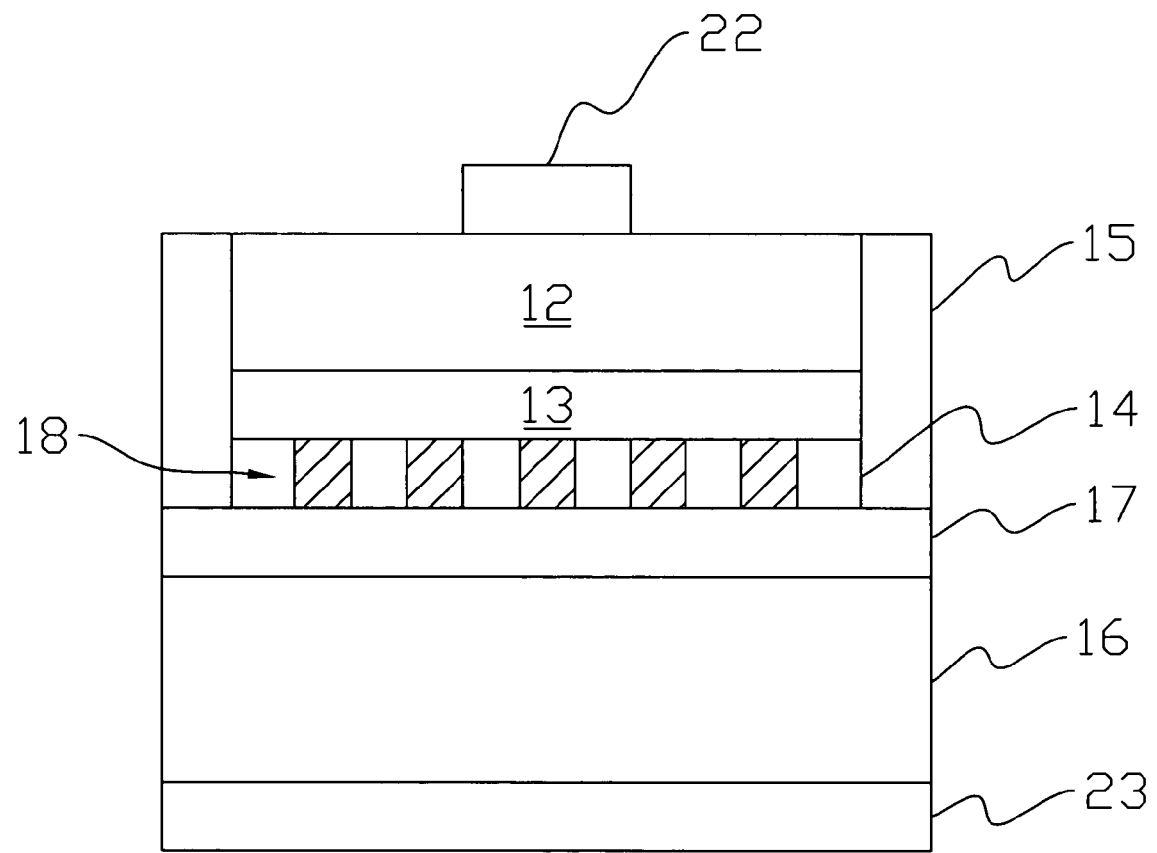

As shown in FIG. 2C, the electrical connector 18 penetrates the interfacial layer 15 to enter into the first coupling layer 14 and reach the electrically conductive reflector 13. In another aspect, the first coupling layer 14 and the second coupling layer 17 are compressed to contact with each other. In the case, provided a suitable material is chosen for the first coupling layer 14 and the second coupling layer 17, a metal bonding or a eutectic bonding can be formed between the two parts. Provided a suitable material is chosen for the electrical connector 18 and the first coupling layer 14, a metal bonding or a eutectic bonding can accordingly be formed between the two parts. In present embodiment, because the electrical connector 18 and reflector 13 are electrically connected, the first coupling layer 14 can be otherwise made by introducing an insulating material suitable for glue bonding.

Figure 2D:
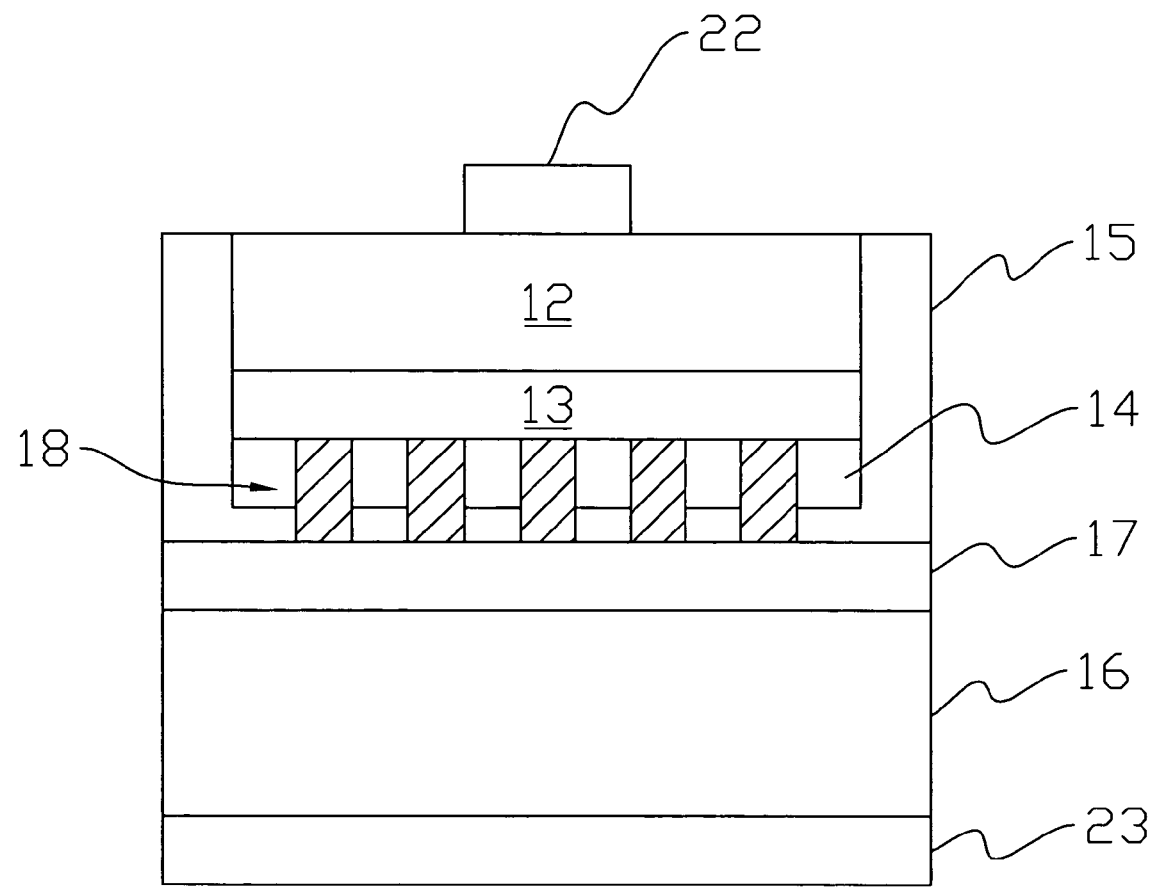

Another embodiment is shown in FIG. 2D. The electrical connector 18 penetrates the interfacial layer 15 to enter into the first coupling layer 14 and reach the electrically conductive reflector 13. In addition, in present embodiment, the interfacial layer 15 is interposed between the first coupling layer 14 and the second coupling layer 17, and keeps them from directly contacting with each other. In the case, provided a suitable material is chosen for the electrical connector 18 and the first coupling layer 14, a metal bonding or a eutectic bonding can be formed between the two parts. In present embodiment, because the electrical connector 18 and reflector 13 are already electrically connected, the first coupling layer 14 can be otherwise made by introducing an insulating material suitable for glue bonding. The alternatives of FIGS. 2A~2D can be deliberately modified to use in each of the embodiments of present invention.

In the foregoing embodiments, the reflector 13 may be omitted from the device 10 if the first coupling layer 14 is made of a reflective material such as Au or Ag. In the case, the reflecting and coupling functions are unified into a single structure like the first coupling layer 14.

Figure 3A:
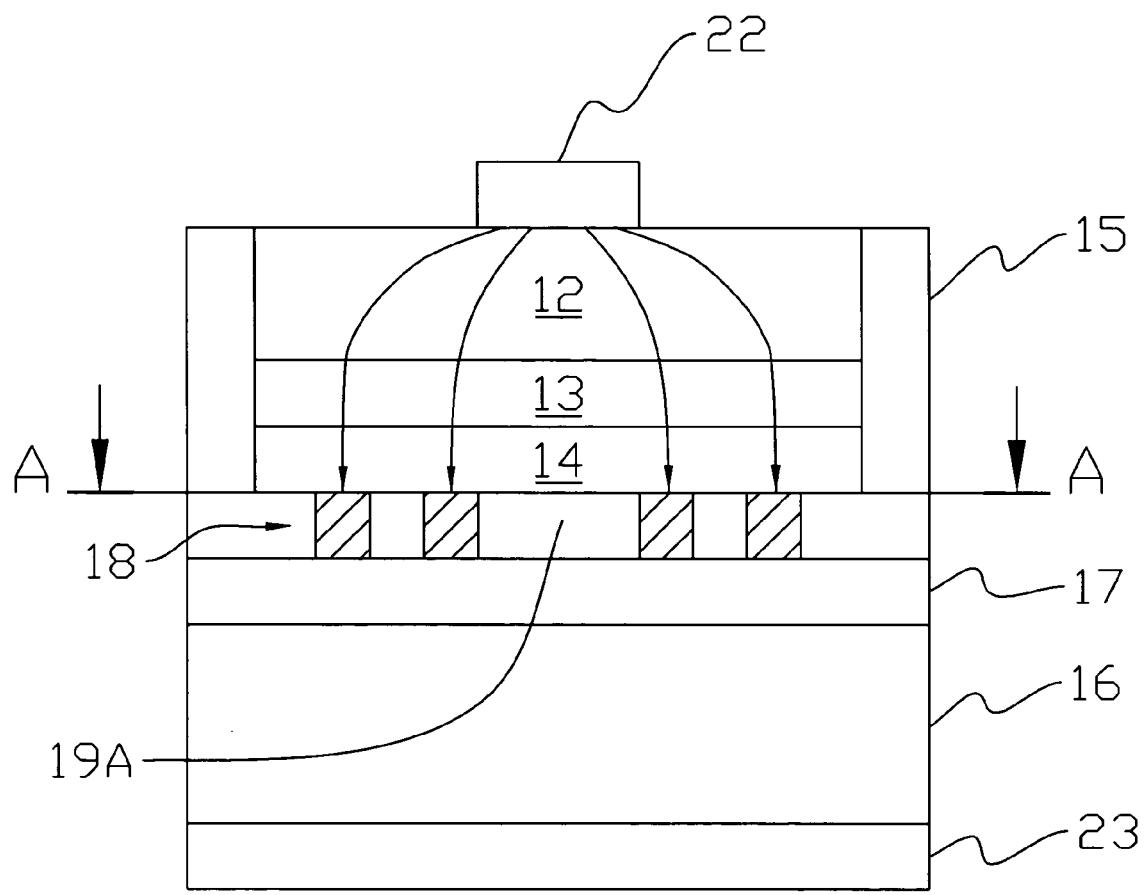
FIGS. 3A and 3B illustrate an optoelectronic semiconductor device in accordance with an embodiment of present invention.

One consideration of arranging the electrical connector 18 is how to form a uniform current density among the semiconductor system 12. In a common circumstance, current is injected into the semiconductor system 12 from the electrode 22 and left through the electrode 23 along the shortest electrical passage. Therefore, the area of the semiconductor system 12 beneath the electrode 22 usually has higher current density, which is called "current crowding" effect. In other words, more photons are created in the area beneath the electrode 22. However, those photons are often absorbed, reflected, or scattered by the electrode 22, and become useless. Under the electrode 22, instead of the electrical connector 18, an insulating region 19A is therefore formed on the semiconductor system 10 as shown in FIG. 3A. The insulating region can bring out a current blocking effect, which makes the current from the electrode 22 detour the area beneath the electrode 22 to spread out and flow back to the electrical connector 18 among the semiconductor system 12. Accordingly, the optoelectronic conversion can occur in larger area of the semiconductor system 12. The material of the insulating region 19A can be different from or the same as that of the interfacial layer 15. Moreover, the entire insulating region 19A is not necessarily constructed by insulating material, but has a structure able to obstruct the current to flow through itself, or possesses a higher electrical resistance than the electrical connector 18. For example, the electrical connector 18 corresponding to the position of the electrode 22 is made to have an elevation lower than that of the other electrical connectors, or an insulating layer is formed between the electrical connector 18 corresponding to the position of the electrode 22 and the conductive material over the connector 18.

Figure 3B:
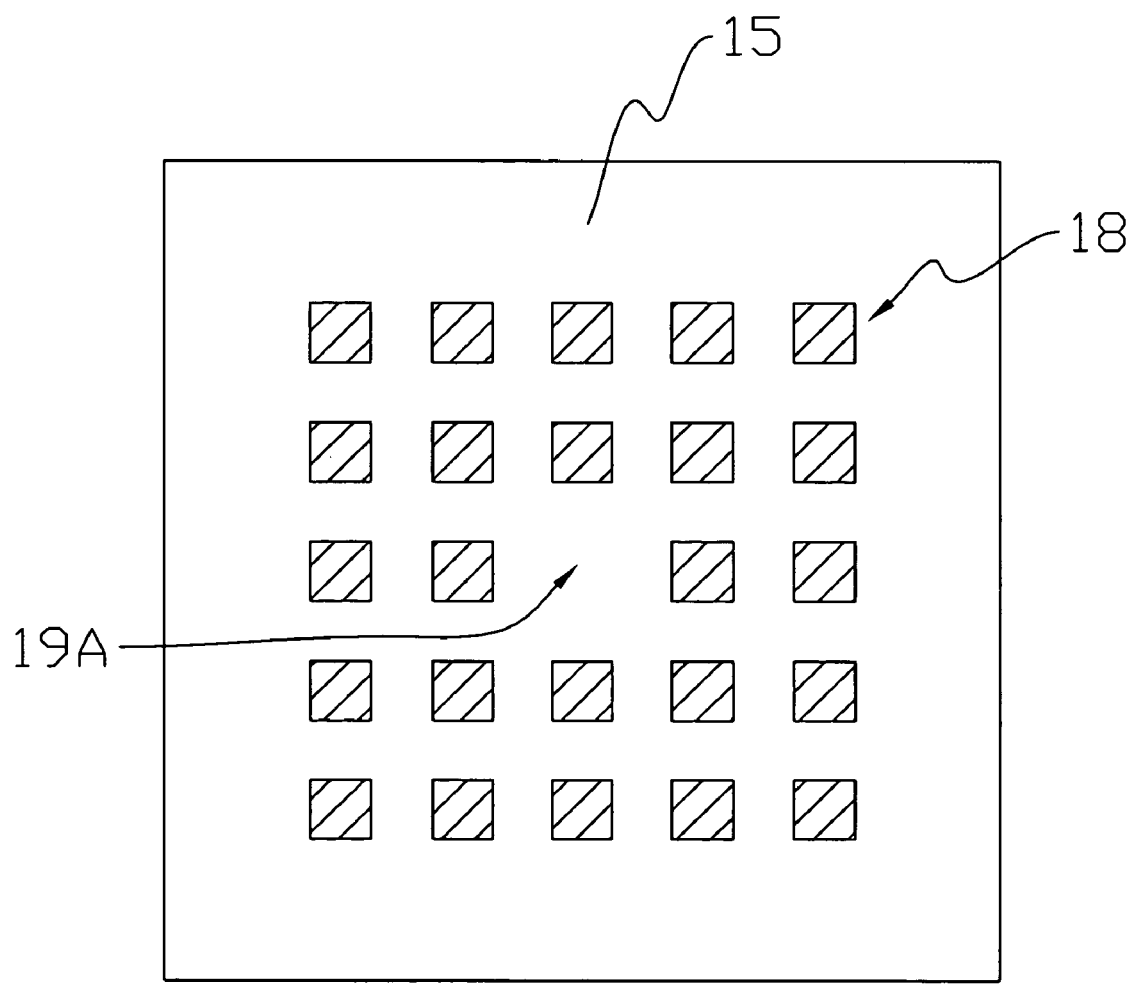

FIG. 3B shows a cross sectional view along AA line of FIG. 3A. In the drawing, the electrical connectors 18 are arranged in a matrix configuration in the interfacial layer 15, except in the insulating region 19A. The pitch of the electrical connector 18 is adjusted in a constant, variable, geometric series, random, variable periodicity, constant periodicity, or quasi-periodicity configuration. The position and shape of the insulating region 19A are arranged to correspond to those of the electrode 22. The area of the insulating region 19A can be smaller than, equivalent to, or greater than that of the electrode 22. The electrical connector 18 is formed in a shape including but not limited to rectangle, circle, ellipse, triangle, hexagon, irregularity, and the combination thereof.

Figure 4A:
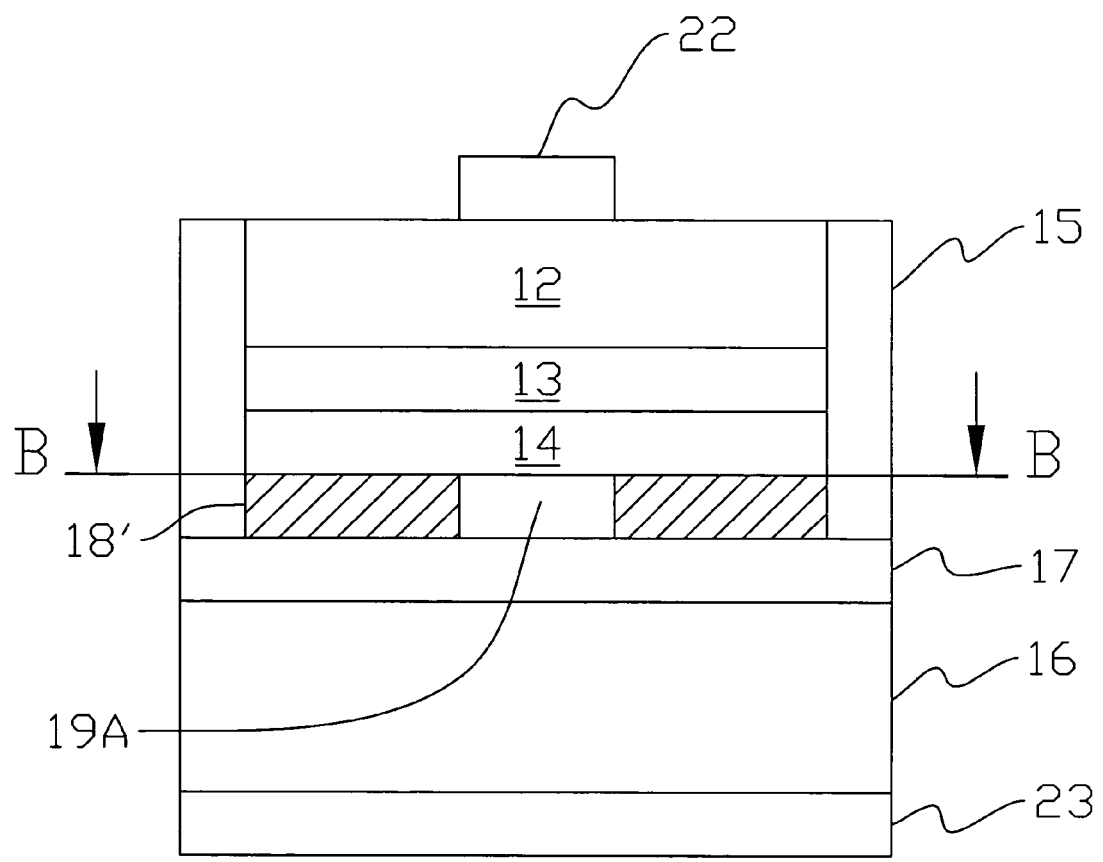
FIGS. 4A and 4B illustrate an optoelectronic semiconductor device having an insulating region in accordance with another embodiment of present invention.
Figure 4B:
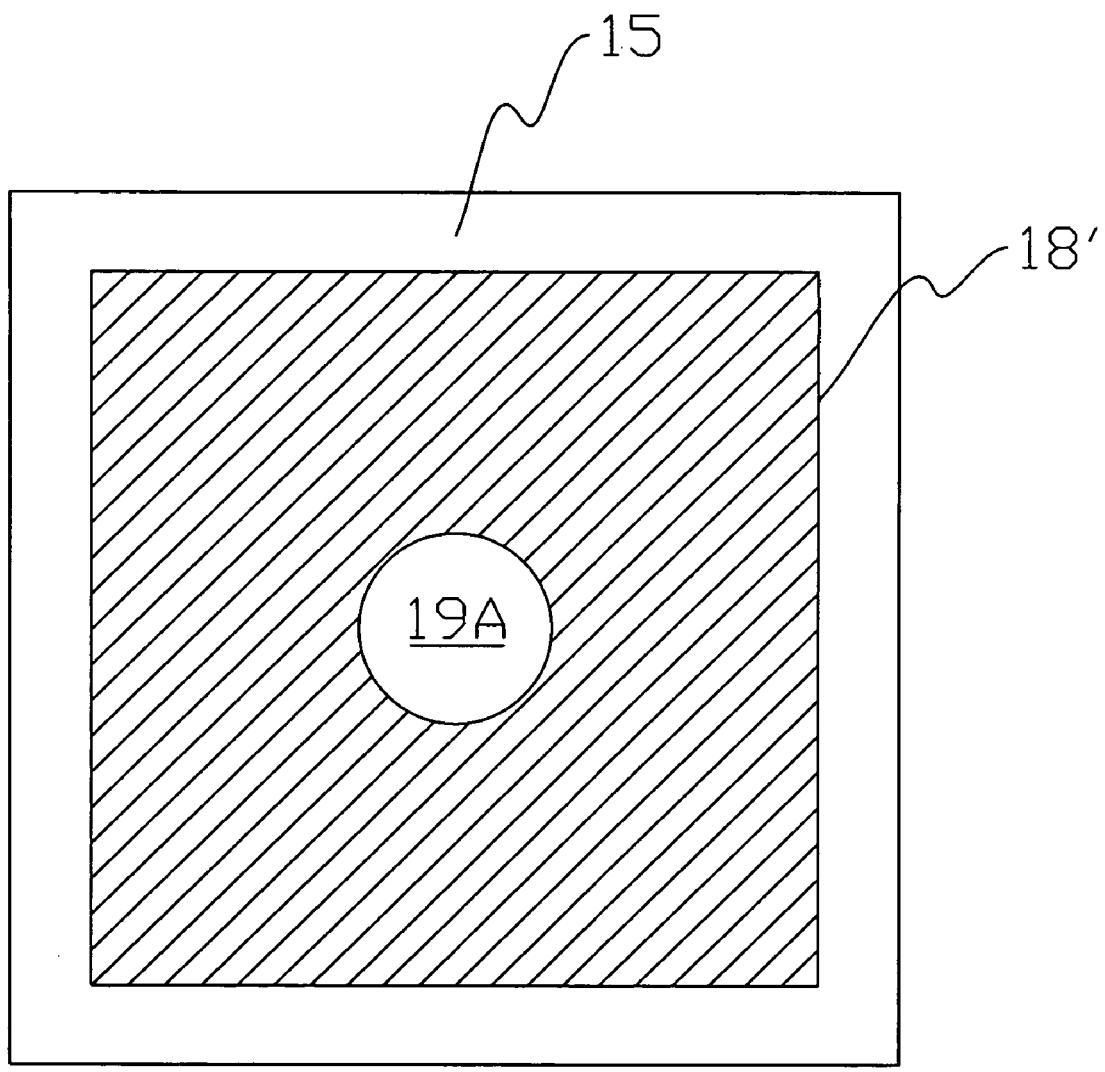
Figure 5:
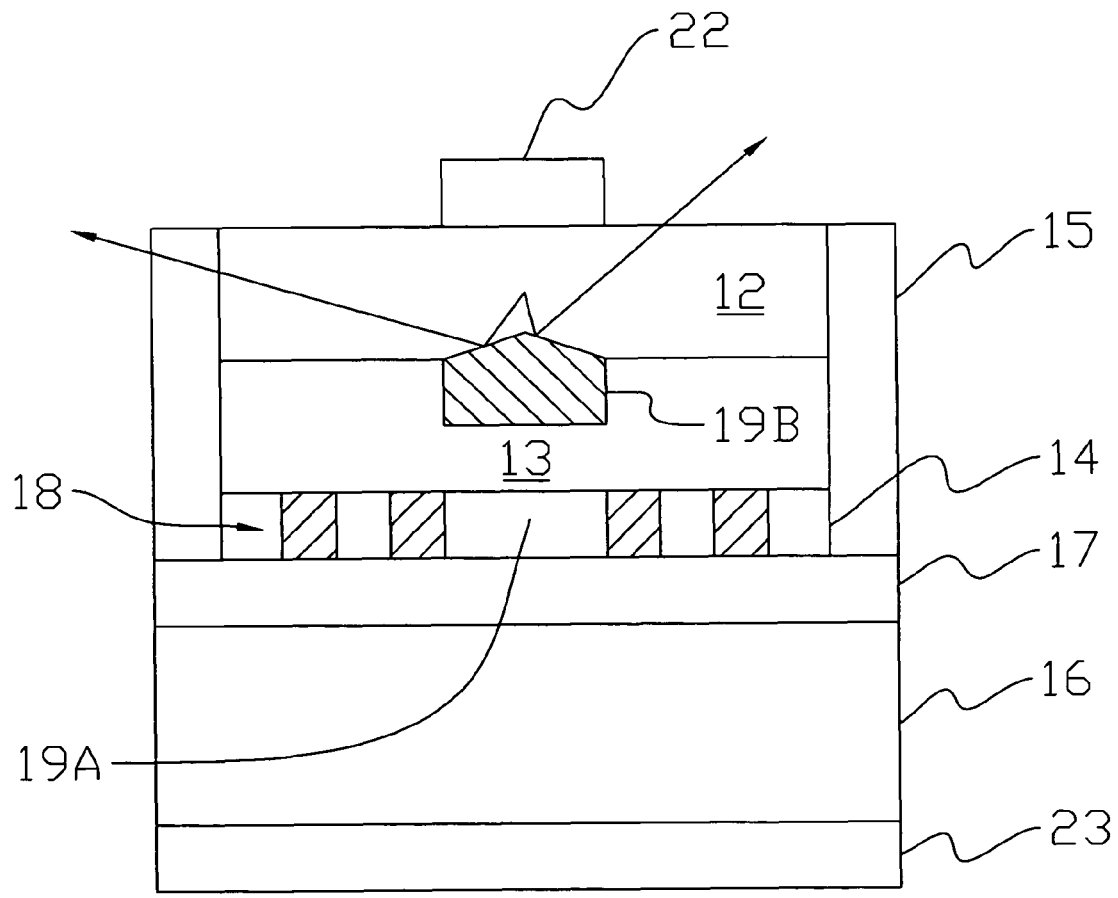
FIG. 5 illustrates an optoelectronic semiconductor device having an insulating region in accordance with an embodiment of present invention.

Furthermore, in another embodiment of present invention, as shown in FIGS. 4A and 4B, the electrical connector 18' is formed in a continuous configuration. FIG. 4B shows a cross sectional view along line BB of FIG. 4A. Under the same configuration as aforementioned embodiment, the insulating region 19A is formed in the electrical connector 18' corresponding to the position of the electrode 22. In present embodiment, the contact area of the continuous electrical connector 18' and the first coupling layer 14 is greater than that of the distributed electrical connectors 18 and the first coupling layer 14. In other words, less material of the interfacial layer 15 is interposed between the electrical connector 18' and the first coupling layer 14.

In FIGS. 3A~4B, the insulating region 19A and the electrical connector 18 are formed on about the same horizontal plane, but present invention is not limited thereto. A current-blocking structure may be formed between the electrode 22 and the electrode 23, or the electrode 22 and the electrical conductor 16, in any elevation corresponding to the electrode 22.

In another embodiment of present invention, an insulating region 19B is further formed between the reflector 13 over the insulating region 19A, and the semiconductor system 12 for a better current spreading result. The insulating region 19B is identical to or different from the interfacial layer 15, or can even constructed by a structure as long as it is able to obstruct or decrease current flowing through the region, rather than a structure entirely made by insulating material. The insulating region 19A of present embodiment does not necessarily coexist with the insulating region 19B, that is, the electrical connector 18 can be still formed under the insulating region 19B. Moreover, the top surface of the insulating region 19B is formed in a geometric pattern including but not limited to flat plane, rough surface, textured surface, and even ridged surface as shown in the drawing. Provided the ridged surface is reflective, light from the semiconductor system 12 is reflected outwardly by the ridged surface, and light is consequently absorbed by the electrode 22 with lower probability.

Figure 6A:
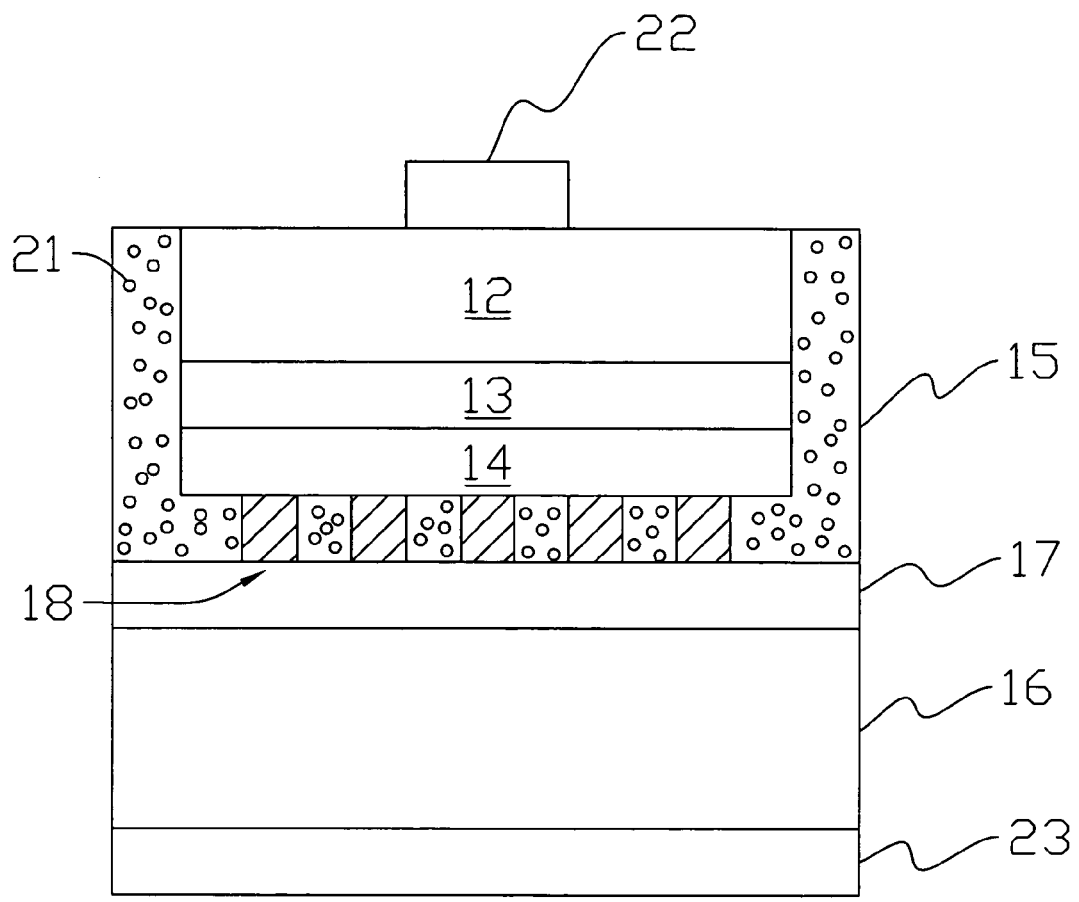
FIGS. 6A~6C illustrate optoelectronic semiconductor devices in accordance with further embodiments of present invention.
Figure 6B:
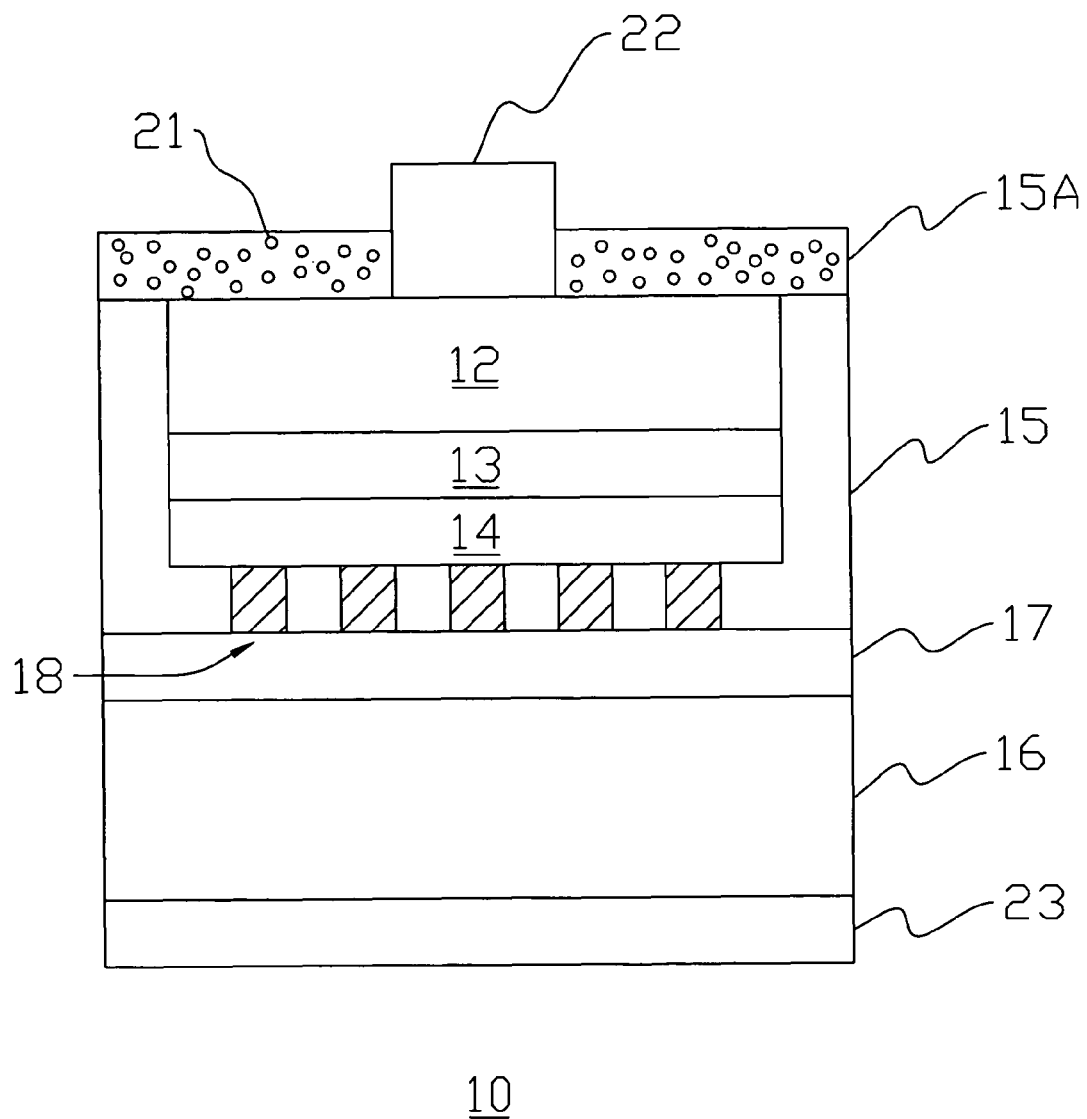
Figure 6C:
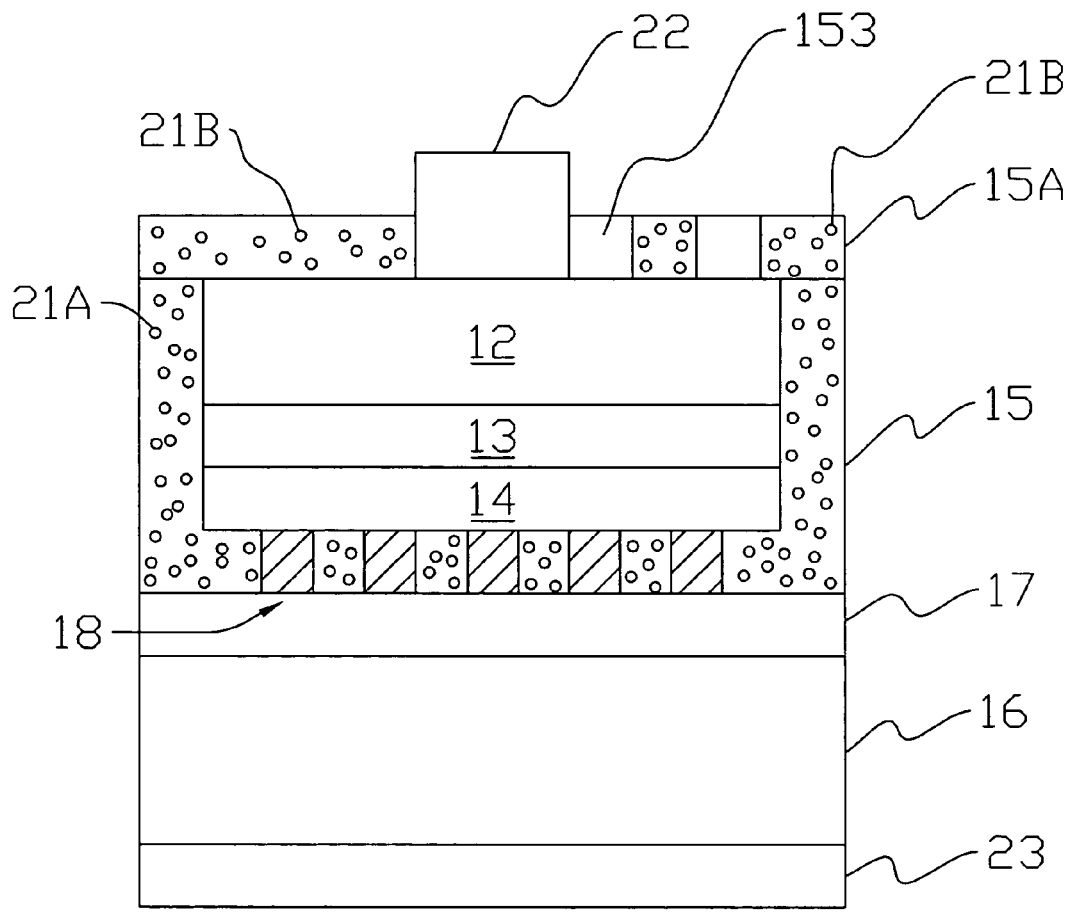

The other embodiments of present invention are shown in FIGS. 6A~6C. A wavelength converting material 21 is blent into the interfacial layer 15 of the optoelectronic semiconductor device 10 of FIG. 6A. The wavelength converting material 21 is responsive to one wavelength-radiation come from the semiconductor system 12 to produce another wavelength-radiation, and is made of phosphor or dye. The phosphor having a suitable particle diameter can reach a better light-emitting performance. The preferable particle diameter is less than 5 μm, and the relevancy can be referred to U.S. Pat. No. 6,245,259. The optoelectronic semiconductor system 10 can bring out white light by adopting the semiconductor system 12 of blue wavelength spectrum and a phosphor such as Yttrium Aluminum Garnet (YAG), Terbium Aluminum Garnet (TAG, Silicate-based phosphor, or oxynitride.

As shown in FIG. 6B, an upper interfacial layer 15A mixed with the wavelength converting material 21 is formed on the semiconductor system 12. The upper interfacial layer 15A can be made by the material directed to the foregoing interfacial layer 15. As shown in FIG. 6C, the interfacial layer 15 and the upper interfacial layer 15A covering the periphery of the semiconductor 12 are mixed with the wavelength converting material 21, and the two layers may have different or the same wavelength converting material inside. Moreover, the upper interfacial layer 15A can be patterned to set the distribution boundary of the wavelength converting material. The void region 153 as shown in the drawing is a region with material, such as air, insulating material, another kind of phosphor, or indium tin oxide (ITO), different from that of the upper interfacial layer 15A. It is helpful to spread current into the semiconductor system 12 if the conductor within the void region 153 is connected to the electrode 22.

Figure 7:
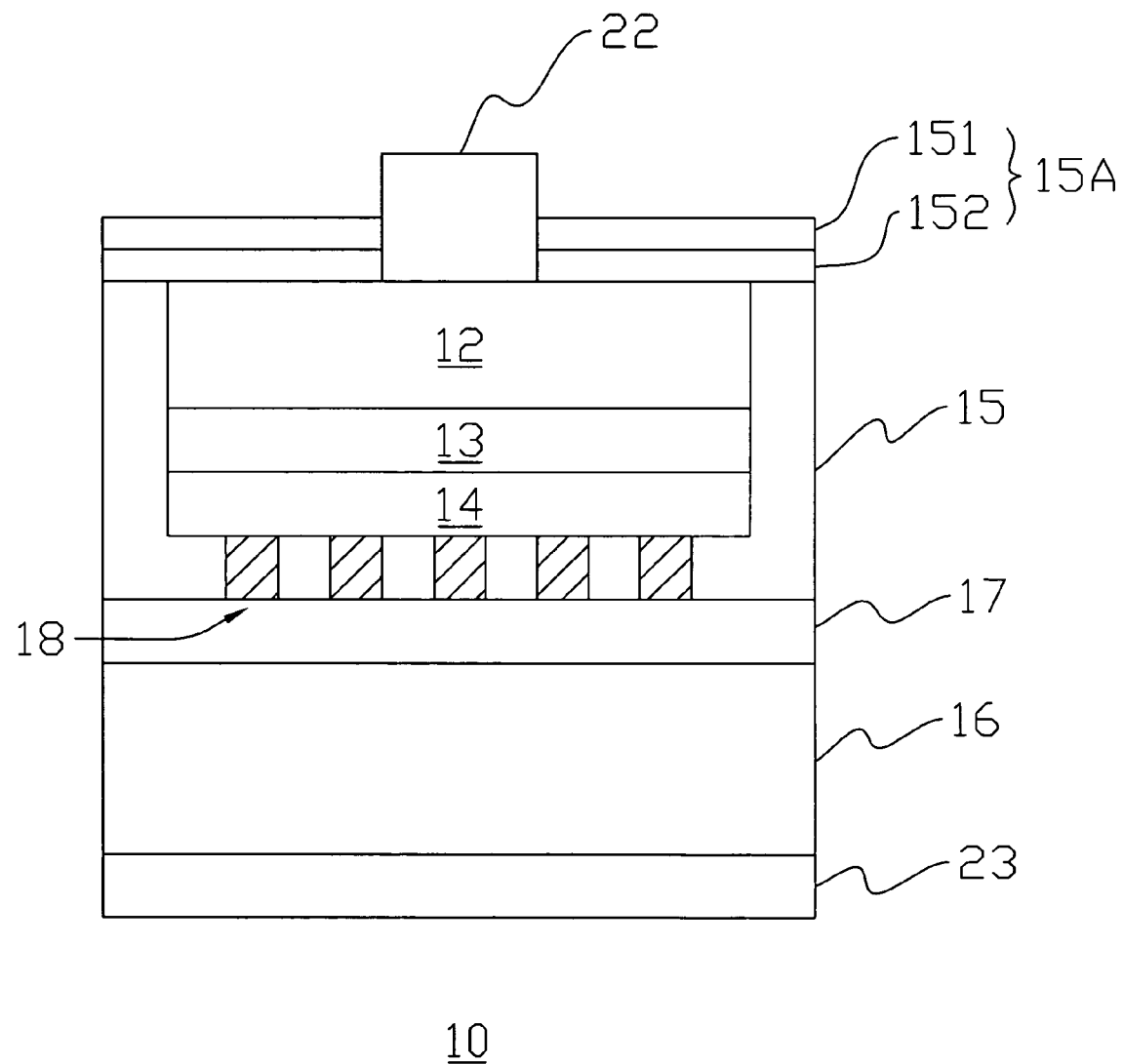
FIG. 7 illustrates an optoelectronic semiconductor device having a passive light-emitting layer in accordance with an embodiment of present invention.

The upper interfacial layer 15A of the optoelectronic semiconductor device 10 of FIG. 7 at least includes a passive light-emitting layer 151 and a bonding layer 152. The passive light-emitting layer 151 is such as a bulk phosphor, an III-V series semiconductor layer, or an II-VI series semiconductor layer. The bonding layer 152 is made of at least one organic material including PI, benzocyclobutene, PFCB, and epoxy. The passive light-emitting layer 151 is induced to produce output light in response to input light from the semiconductor system 12, and the input light and output light have a different wavelength or spectrum.

Figure 8:
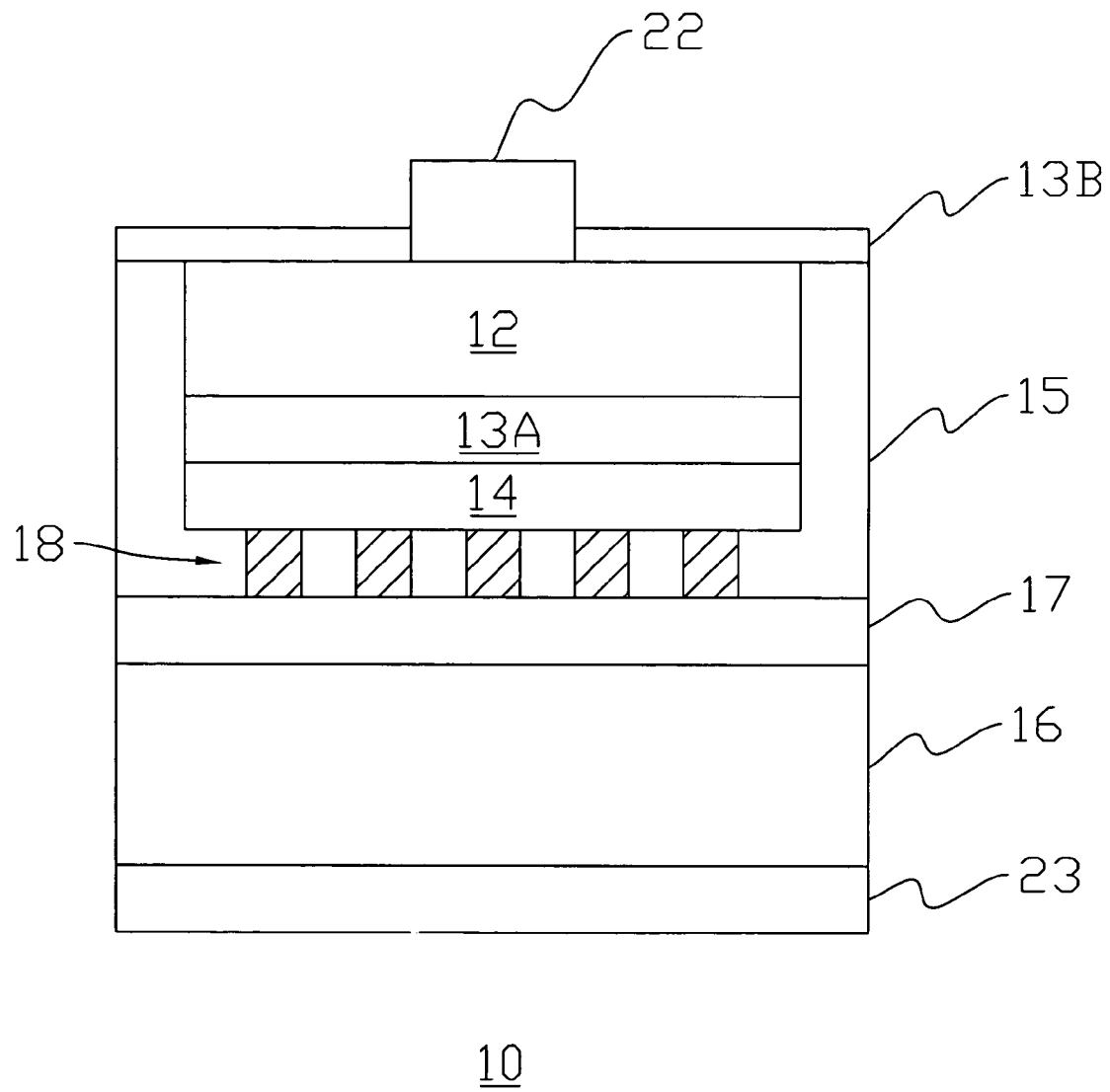
FIG. 8 illustrates an optoelectronic semiconductor device having two reflectors in accordance with an embodiment of present invention.

Another embodiment of present invention is illustrated in FIG. 8. The optoelectronic semiconductor device 10 includes a lower reflector 13A and an upper reflector 13B. The material of the two reflectors can be referred to aforementioned material directed to the reflector 13. Light from the semiconductor system 12 is reflected to the interfacial layer 15 by the two reflectors. The light leaving the optoelectronic semiconductor device 10 is probably reflected outwardly if it is reflected back to the semiconductor system 12 by an external object.

Figure 9:
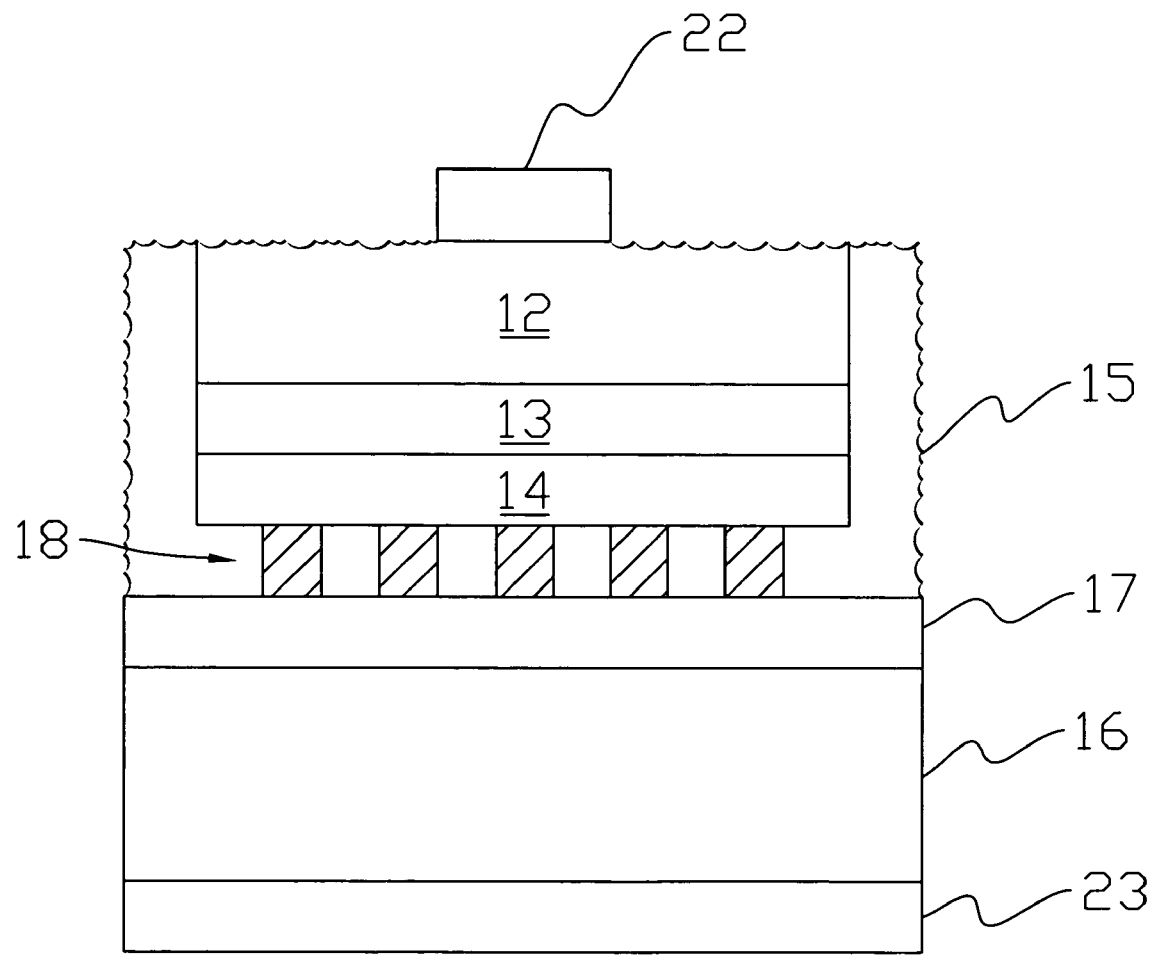
FIG. 9 illustrates an optoelectronic semiconductor device having a textured light output surface in accordance with an embodiment of present invention.

The optoelectronic semiconductor device 10 in accordance with another embodiment is illustrated in FIG. 9 and has a textured or rough outer surface. The textured or rough outer surface can destroy the total reflection between the structure and the environmental medium and increase the light extraction of the optoelectronic semiconductor device 10. The textured or rough outer surface can be formed on the semiconductor system 12, the interfacial layer 15, or the outer surfaces of both. The roughness of the rough surface has to reach a level such that the light extraction can be elevated. The textured surface can be formed in a regular or irregular convex and concave structure or a photonic crystal structure.

Figure 10:
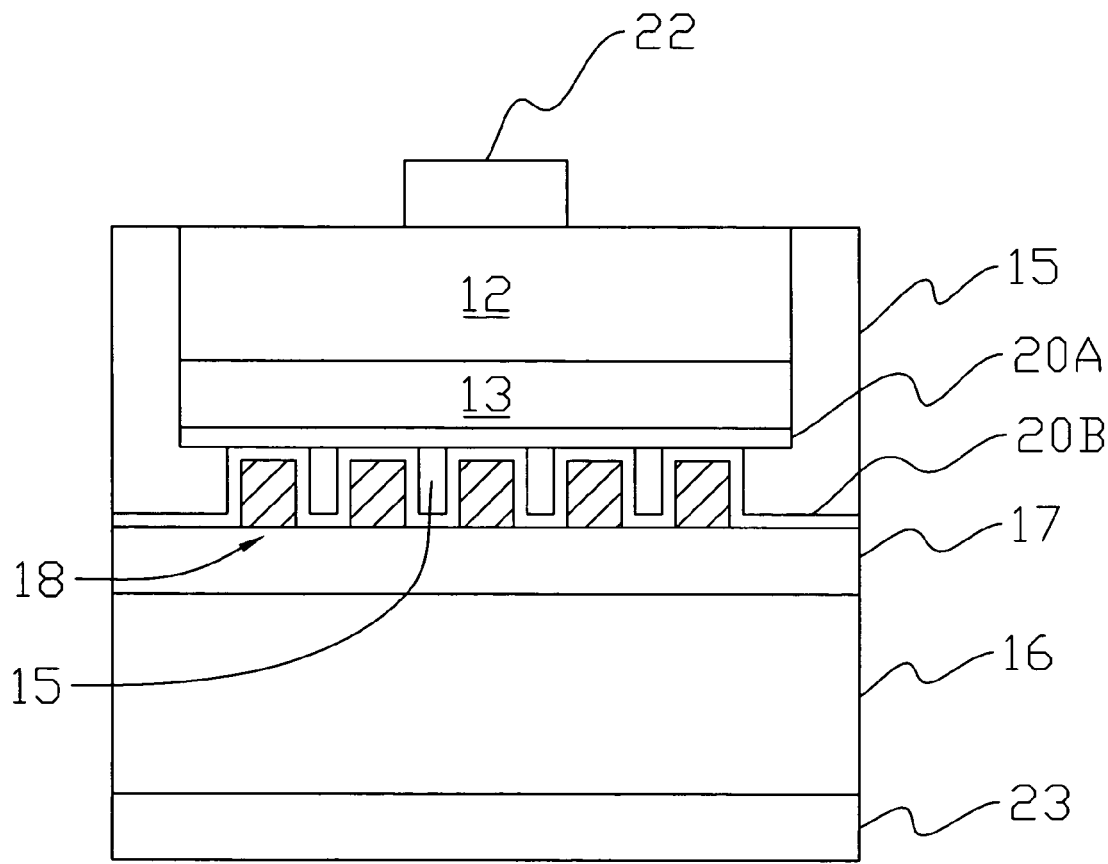
FIG. 10 illustrates an optoelectronic semiconductor device in accordance with an embodiment of present invention.

FIG. 10 shows another embodiment of present invention. In present embodiment, the semiconductor system 12 and the electrical conductor 15 of the optoelectronic semiconductor device 10 are electrically connected with each by a first intermediate layer 20A, the electrical connector 18, and the second intermediate layer 20B. During the manufacturing process, the electrical connector 18 can be pre-covered by the second intermediate layer 20B and then coupled with the semiconductor system 12 where the first intermediate layer 20A is formed. The first intermediate layer 20A and the second intermediate layer 20B are contacted with each other by compressing the interfacial layer 15. The constructing material of the interfacial layer 15 potentially remains in a trench between the electrical connectors 18. Not only an ohmic contact but a firm physical contact is formed between the first intermediate layer 20A and the second intermediate layer 20B. The material of each of the two layers is Ti or Cr.

Figure 11:
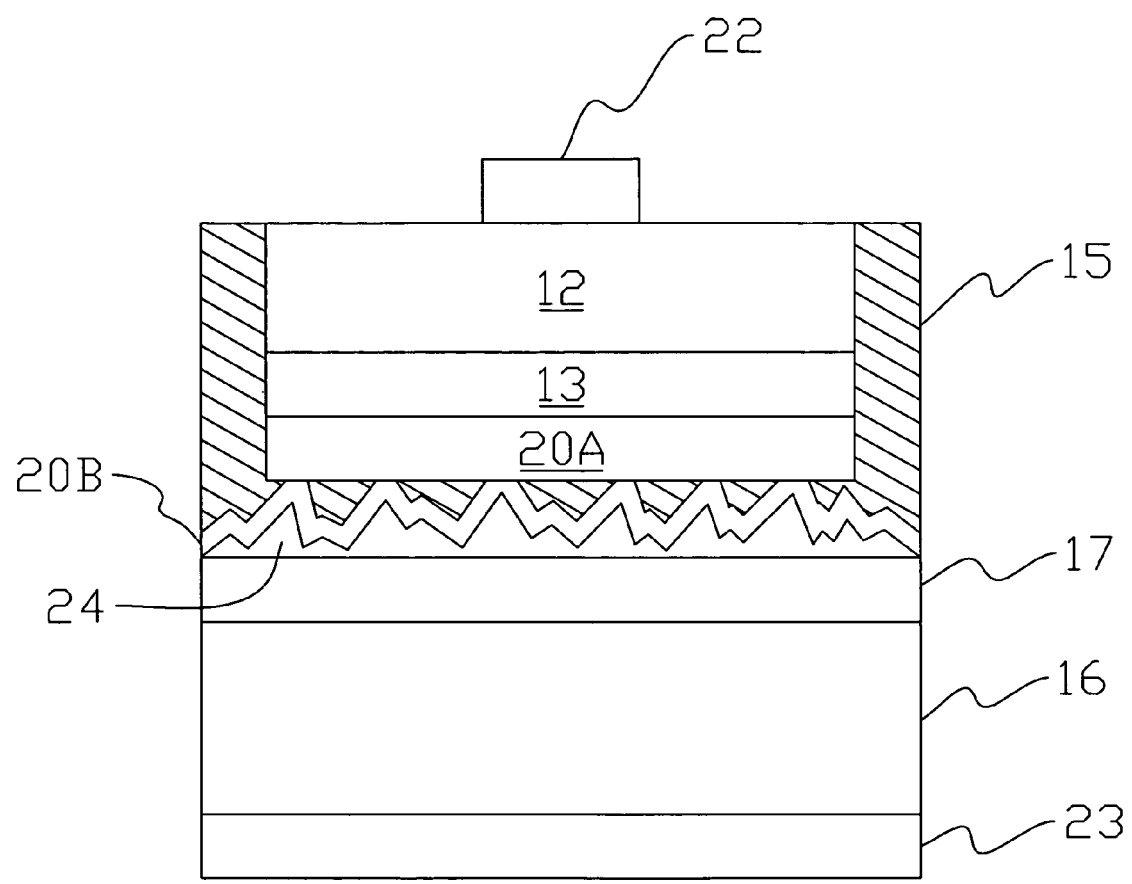
FIG. 11 illustrates an optoelectronic semiconductor device in accordance with further embodiment of present invention.

FIG. 11 shows another embodiment of present invention. The electrical connectors 24 of the optoelectronic semiconductor device 10 are formed as an irregular structure such as a rough surface. The material of the first intermediate layer 20A and the second intermediate layer 20B is described above. In present embodiment, the electrical connector 24 is covered by the second intermediate layer 20B and not yet been flattened completely. At least some protrusions of the second intermediate layer 20B are made to penetrate the interfacial layer 15 and contact with the first intermediate layer 20A. The constructing material of the interfacial layer 15 which potentially remains in the recesses of the rough electrical connector 24 is beneficial to connect the first intermediate layer 20A and the second interfacial layer 20B.

The foregoing description has been directed to the specific embodiments of this invention. It will be apparent; however, that other alternatives and modifications may be made to the embodiments without escaping the spirit and scope of the invention.

What is claimed is:

1. An optoelectronic semiconductor device comprising:
   a semiconductor system converting between light energy and electrical energy, wherein said semiconductor system has a plurality of surfaces;
   an interfacial layer formed on at least two surfaces of the semiconductor system;
   an electrical conductor supporting the semiconductor system; and
   electrical connectors arranged in a geometric pattern for uniform current spreading in the semiconductor system and passing through the interfacial layer and electrically connecting to the semiconductor system and the electrical conductor.

2. The optoelectronic semiconductor device of claim 1, wherein the optoelectronic semiconductor system comprises a light-emitting diode.

3. The optoelectronic semiconductor device of claim 1, wherein the interfacial layer is formed between the semiconductor system and the electrical conductor.

4. The optoelectronic semiconductor device of claim 1, wherein the interfacial layer overlays on at least one side surface of the semiconductor system.

5. The optoelectronic semiconductor device of claim 1, wherein the interfacial layer has a refraction index between the semiconductor system and an environmental medium.

6. The optoelectronic semiconductor device of claim 1, further comprising a reflector located between the semiconductor system and the electrical conductor for reflecting light from the semiconductor system.

7. The optoelectronic semiconductor device of claim 1, further comprising a first coupling layer and a second coupling layer respectively arranged on opposite sides of the electrical connectors and electrically connected with each other.

8. The optoelectronic semiconductor device of claim 1, further comprising a first coupling layer electrically connected to the semiconductor system and being entered into by at least part of the electrical connectors.

9. The optoelectronic semiconductor device of claim 1, further comprising a first coupling layer electrically connected to the semiconductor system and reflecting light from the semiconductor system.

10. The optoelectronic semiconductor device of claim 1, further comprising:
    a first coupling layer electrically connected to the semiconductor system; and
    a reflector located between the first coupling layer and the semiconductor system reflecting light from the semiconductor system.

11. The optoelectronic semiconductor device of claim 1, further comprising a reflector located between the electrical connectors and the semiconductor system and contacting with the electrical connectors.

12. The optoelectronic semiconductor device of claim 1, wherein the electrical connectors have gaps varied in a configuration selected from the group consisting of constant periodicity, variable periodicity, quasi-periodicity, geometric series, and randomness.

13. The optoelectronic semiconductor device of claim 1, wherein the electrical connectors comprise an electrical connector being formed in a shape selected from the group consisting of rectangle, circle, ellipse, triangle, hexagon, irregular shape, and the combination thereof.

14. The optoelectronic semiconductor device of claim 1, wherein the electrical connector comprises a rough surface.

15. The optoelectronic semiconductor device of claim 1, further comprising:
    a first intermediate layer electrically connecting to the semiconductor system; and
    a second intermediate layer formed on the electrical connectors and between the first intermediate layer and the electrical connectors.

16. The optoelectronic semiconductor device of claim 1, further comprising:
    an electrode formed on the semiconductor system; and
    an insulating region corresponding to a position of the electrode and substantially arranged on the same horizontal plane with the electrical connectors.

17. The optoelectronic semiconductor device of claim 1, further comprising:
    an electrode formed on the semiconductor system; and
    an insulating region corresponding to a position of the electrode and arranged on a different horizontal plane from the electrical connectors.

18. The optoelectronic semiconductor device of claim 1, wherein the interfacial layer comprises a wavelength converting material.

19. The optoelectronic semiconductor device of claim 1, further comprising:
    a passive light-emitting layer formed on a surface of the semiconductor system opposite to the electrical connectors, and emitting output light in response to input light from the semiconductor system, wherein the input light and the output light have a different wavelength.

20. The optoelectronic semiconductor device of claim 1, further comprising a light extraction surface formed on a primary light output surface of the semiconductor system and in a configuration selected from the group consisting of rough surface, regular convex and concave structure, irregular convex and concave structure, and photonic crystal.

21. An optoelectronic semiconductor device comprising:
    a semiconductor system of at least two semiconductor layers and an active layer inbetween the semiconductor layers, wherein said semiconductor system has a plurality of surfaces;
    an interfacial layer formed on at least two surfaces of the semiconductor system;
    an electrical conductor supporting the semiconductor system; and
    an electrical connector below the semiconductor system and passing through the interfacial layer to electrically connect to the semiconductor system and the electrical conductor.

22. The optoelectronic semiconductor device of claim 21, wherein the optoelectronic semiconductor system comprises a light-emitting diode and further comprises an upper electrode above the semiconductor system and a lower electrode below the electrical conductor.

23. The optoelectronic semiconductor device of claim 21, wherein the electrical conductor comprises an electrode.

* * * * *